US012687438B2

(12) United States Patent
Winkler et al.

(10) Patent No.: US 12,687,438 B2
(45) Date of Patent: Jul. 21, 2026

(54) CIRCUIT ARRANGEMENT, ELECTRICAL SYSTEM, AND METHOD FOR ASCERTAINING BARRIER LAYER TEMPERATURES OF GATE-CONTROLLED SEMICONDUCTOR COMPONENTS

(71) Applicant: Robert Bosch GmbH, Stuttgart (DE)

(72) Inventors: Jonathan Winkler, Sonnenbuehl (DE); Manuel Riefer, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 302 days.

(21) Appl. No.: 18/569,327

(22) PCT Filed: Jul. 1, 2022

(86) PCT No.: PCT/EP2022/068251
§ 371 (c)(1),
(2) Date: Dec. 12, 2023

(87) PCT Pub. No.: WO2023/006337
PCT Pub. Date: Feb. 2, 2023

(65) Prior Publication Data
US 2024/0272012 A1      Aug. 15, 2024

(30) Foreign Application Priority Data
Jul. 27, 2021     (DE) ..................... 10 2021 208 082.0

(51) Int. Cl.
*H03K 17/06*          (2006.01)
*G01K 7/01*           (2006.01)
(Continued)

(52) U.S. Cl.
CPC ......... *G01K 7/01* (2013.01); *H03K 17/08122* (2013.01); *G01K 2217/00* (2013.01); *H03K 2017/0806* (2013.01)

(58) Field of Classification Search
CPC ...... H03K 17/06; H03K 17/063; H03K 17/08; H03K 17/081; H03K 17/0812;
(Continued)

(56) References Cited

U.S. PATENT DOCUMENTS

| | | | |
|---|---|---|---|
| 2004/0131104 A1 | 7/2004 | Seferian | |
| 2018/0372553 A1* | 12/2018 | Ewanchuk | ........... H03K 17/145 |
| 2020/0132557 A1 | 4/2020 | Strzalkowski | |

FOREIGN PATENT DOCUMENTS

| | | |
|---|---|---|
| DE | 102010000875 A1 | 7/2011 |
| DE | 102014203655 A1 | 9/2015 |

(Continued)

OTHER PUBLICATIONS

International Search Report for PCT/EP2022/068251, Issued Sep. 30, 2022.
(Continued)

*Primary Examiner* — Long Nguyen
(74) *Attorney, Agent, or Firm* — NORTON ROSE FULBRIGHT US LLP

(57) ABSTRACT

A circuit arrangement, an electrical system, and a method for determining barrier layer temperatures of gate-controlled semiconductor components. First and second semiconductor components of the circuit arrangement are connected in parallel and activated using a gate control circuit which, in an active forward mode of the two semiconductor components, varies a first gate voltage of the first semiconductor component using a first signal, and to varies a second gate voltage of the second semiconductor component using a second signal that is opposite the first signal. An evaluation unit of the circuit arrangement is configured to use first and second current measuring devices to measure first and second gate currents of the first and second semiconductor components, respectively, and to determine in each case, based on the particular varied gate voltages and the respec- (Continued)

tive corresponding gate currents, respective barrier layer temperatures of the two semiconductor component.

10 Claims, 2 Drawing Sheets

(51) Int. Cl.
    *H03K 17/0812*        (2006.01)
    *H03K 17/08*          (2006.01)
(58) Field of Classification Search
    CPC ............. H03K 17/08122; H03K 17/14; H03K 17/145; H03K 17/687; H03K 17/6871; H03K 17/6874; H03K 2017/0806; H03K 19/003; H03K 19/00315; H03K 19/00369; H03K 19/00384; G01K 7/01; G01K 7/015; G01K 7/42; G01K 2217/00
    See application file for complete search history.

(56) References Cited

FOREIGN PATENT DOCUMENTS

| EP | 3208586 A1 | 8/2017 |
|----|------------|--------|
| JP | 5151881 B2 | 2/2013 |

OTHER PUBLICATIONS

Brandelero et al., "Selective Gate Driving in Intelligent Power Modules," IEEE Transactions on Power Electronics, vol. 36, No. 1, 2021, pp. 898-910.
Denk et al., "IGBT Gate Driver With Accurate Measurement of Junction Temperature and Inverter Output Current," PCIM Europe 2017; International Exhibition and Conference for Power Electronics, Intelligent Motion, Renewable Energy and Energy Management, 2017.

* cited by examiner

CIRCUIT ARRANGEMENT, ELECTRICAL SYSTEM, AND METHOD FOR ASCERTAINING BARRIER LAYER TEMPERATURES OF GATE-CONTROLLED SEMICONDUCTOR COMPONENTS

FIELD

The present invention relates to a circuit arrangement, an electrical system, and a method for ascertaining barrier layer temperatures of gate-controlled semiconductor components.

BACKGROUND INFORMATION

In particular for power electronics applications, an instantaneous barrier layer temperature of power semiconductors is the most important state variable besides an instantaneously flowing current. Therefore, the maximum allowable barrier layer temperature is already taken into account in the design of the power semiconductors, since only below this temperature can reliable operation of the power semiconductors be ensured.

The performance capability of such power semiconductors is preferably exploited to the greatest extent possible; i.e., the power semiconductors are placed under load, if possible, in such a way that their temperatures just reach the maximum allowable barrier layer temperature. Exact knowledge of the instantaneous barrier layer temperature during operation is thus necessary in order to carry out load reduction or other measures, if needed, to prevent an unallowable temperature rise.

The barrier layer temperatures are generally determined in the immediate vicinity of the semiconductor with the aid of a sensor element (a temperature-dependent resistor, for example). "IGBT Gate Driver with Accurate Measurement of Junction Temperature and Inverter Output Current," M. Denk and M. M. Bakran, Proceedings of PCIM Europe 2017, describes a method in which in a switched-off state of an IGBT, a high-frequency alternating voltage having a small amplitude is added to a negative gate voltage of the IGBT. By measuring the current in the gate circuit of the IGBT, it is possible to utilize this current as a temperature-sensitive parameter, since the current is influenced by the temperature dependency of a parasitic impedance of the IGBT-internal gate terminal.

SUMMARY

According to a first aspect of the present invention, a circuit arrangement for ascertaining barrier layer temperatures of gate-controlled semiconductor components is provided. The circuit arrangement includes a first semiconductor component, a second semiconductor component, a gate control circuit, a first current measuring device, a second current measuring device, and an evaluation unit.

According to an example embodiment of the present invention, the first semiconductor component and the second semiconductor component are gate-controlled semiconductor components that are connected in parallel, and whose respective conductance (i.e., the conductance of particular source-drain paths or of particular emitter collector paths, depending on the type of semiconductor components used) is settable with the aid of the gate control circuit. For this purpose, the gate control circuit includes separate circuit parts with separate outputs that are electrically connected to respective gate terminals of the two semiconductor components, so that an independent activation of the two semiconductor components is made possible with the aid of the gate control circuit. The first and second semiconductor components preferably form an individual topological switch in which the two semiconductor components are always simultaneously switched on/off or set to an identical operating point, without thus limiting the circuit arrangement to such a preferred activation of the two semiconductor components.

According to an example embodiment of the present invention, it is also possible to design the gate control circuit as an individual circuit unit in which, for the independent activation of the two semiconductor components, the particular circuit parts use components that are optionally partially shared, and also to design the gate control circuit as two completely disjunct circuit units which, for example, are also spatially separate from one another.

According to an example embodiment of the present invention, the gate control circuit is configured, at least within a predefined time period, in an active forward mode of the two semiconductor components to vary a first gate voltage of the first semiconductor component with the aid of a first signal, and to vary a second gate voltage of the second semiconductor component with the aid of a second signal that is opposite the first signal, a total conductance that results from the parallel connection of the two semiconductor components (which correspondingly influences a total working current of the parallel connection) remaining essentially constant, while the individual conductances of the respective semiconductor components vary corresponding to the gate activation. The first and second signals are preferably alternating signals in each case, so that varying the particular gate voltages with the aid of the first and second signals effectuates a variation of the particular gate voltages around particular (preferably identically set) operating points of the semiconductor components. The particular operating points are set, for example, by a shared driver circuit or by separate driver circuits for each semiconductor component. In addition, it is possible for the gate driver circuit and the gate control circuit to be a shared circuit unit.

Furthermore, it is pointed out that the total conductance of the two semiconductor components in principle needs to be held constant only to the extent required by a load (an electric motor, for example), which is activated by the combined drain currents or collector currents of the two semiconductor components, for trouble-free operation. In other words, it is possible, based on a particular use scenario, for certain fluctuations of the total conductance to be intentionally accepted, for example to allow use of a simpler and/or more cost-effective gate control circuit. Such fluctuations result, for example, due to tolerances of the semiconductor components and/or of the gate control circuit and/or other influences, which are explained in greater detail below in the course of the description of advantageous specific embodiments.

According to an example embodiment of the present invention, the evaluation unit is designed, for example, as an ASIC, FPGA, processor, digital signal processor, microcontroller, as a discrete analog and/or digital circuit, or the like, and is connected to the first current measuring device and to the second current measuring device using information technology. The first and second current measuring devices are measuring shunts, for example (in each case connected in series to the gate impedances), which are situated in the respective source-gate circuits of the two semiconductor components, whose generated voltage drops are detected via respective voltage sensors. In such an embodiment of the current measuring devices, particular measuring signals of a measurement of the voltage drop are transferred to the evaluation unit via the respective measuring shunts. Furthermore, it is also possible to detect the particular gate currents with the aid of measuring devices that differ from those described above (current sensors, for example).

On this basis, according to an example embodiment of the present invention, the evaluation unit is configured to detect a first gate current of the first semiconductor component with the aid of the first current measuring device, and to detect a second gate current of the second semiconductor component with the aid of the second current measuring device. The evaluation unit is further configured to ascertain in each case, based on the particular varied gate voltages and the respective corresponding gate currents, a barrier layer temperature of the first semiconductor component and of the second semiconductor component. For this purpose, the evaluation unit initially ascertains respective parasitic gate impedances of the two semiconductor components, based on the above variables. With the aid of information concerning the temperature dependency of the gate impedances that is available to the evaluation unit (in the form of a lookup table, for example), the evaluation unit is thus able to ascertain respective barrier layer temperatures of the first and second semiconductor components.

It is pointed out in general that the first semiconductor component and the second semiconductor component are advantageously semiconductor components having an identical design, but that these may also be semiconductor components that differ from one another. Accordingly, due to the separate variation of the particular gate voltages, it is possible to hold a total conductance or total working current essentially constant, even when semiconductor components having different designs are used.

Respective amplitudes of the first signal and of the second signal preferably correspond to a fraction of the operating point voltages of the semiconductor components used (up to 18 V, for example), and are more preferably in a range of several hundred millivolts to several volts, without thus being limited to such a voltage range. In addition, the particular amplitudes are preferably selected in such a way that in the variation of the gate voltages around the operating point, an approximately linear characteristic curve of the semiconductor components in this range may be assumed. Furthermore, the amplitude is preferably selected in such a way that a required resolution or accuracy and/or a necessary signal-to-noise ratio may be maintained when ascertaining the barrier layer temperatures.

Moreover, it is possible to carry out temperature measurements of the semiconductor components repeatedly, in particular at fixed time intervals and/or depending on the situation, for example only in phases with a particularly high current load of the semiconductor components.

Based on the above-described circuit arrangement according to the present invention, numerous advantages may result that are manifested in particular by a quasi-instantaneous and particularly high-resolution temperature measurement. This is due to the fact that the temperature measurement does not take place using a thermally coupled external sensor element (such as an NTC, for example), whose temperature measurement is necessarily accompanied by a certain time delay and low-pass behavior. In addition, the circuit arrangement according to the present invention provides a particularly cost-effective option for implementing independent temperature measurements for all relevant semiconductor components.

Preferred refinements and example embodiments of the present invention are disclosed herein.

In one advantageous embodiment of the present invention, the first semiconductor component and/or the second semiconductor component are/is a MOSFET (for example, a Si MOSFET, a SiC MOSFET, a GaN MOSFET, etc.), or an IGBT or HEMT. In the case of a use of MOSFETs, based on the above description it is possible to also ascertain the temperature in particular in an active reverse mode of the MOSFETs, as a result of which the temperature of the MOSFETs may already be ascertained in the switched-off state. This provides the advantage that a planned switching-on operation may be appropriately suppressed or handled in some other way in the event of unallowable temperature deviations that are possibly present.

The predefined time period for varying the particular gate voltages of the first and second semiconductor components is advantageously a measuring time period for detecting respective barrier layer temperatures of the semiconductor components.

In a further advantageous embodiment of the present invention, the first signal and the second signal are identical signals and/or sinusoidal signals that are phase-shifted by 180° relative to one another (i.e., mirrored with regard to their amplitudes). For explanation: the first signal and the identical second signal, but which is phase-shifted by 180° relative to the first signal, would correspondingly cancel each other out with a direct superimposition of the two signals. It is also possible to form the first signal and the second signal in such a way that, although their respective amplitudes are opposite, their curve patterns are not mirror-symmetrical. The latter is meaningfully usable, for example, in the above-described context of using different semiconductor components for the first and the second semiconductor component. Alternatively or additionally, it is also possible for respective half-waves of the first signal and of the second signal to have an asymmetrical design with respect to one another. The latter is advantageously applicable in particular when deflections of the gate voltages around the operating point are to result in identical changes according to amount in the conductance of the semiconductor components, which possibly are not achievable with half-wave symmetrical signals. Accordingly, via such individual identical changes according to amount in conductance but opposite one another, a total conductance with particularly low fluctuations may be achieved.

According to an example embodiment of the present invention, the evaluation unit is particularly advantageously configured to adapt the first signal and/or the second signal as a function of respective individual conductances and/or of individual working currents and/or of the total conductance and/or of the total working current and/or of respective barrier layer temperatures and/or of respective operating points and/or of an overall temperature of the first semiconductor component and the second semiconductor component.

For this purpose, the evaluation unit is connected to the gate control circuit using information technology, so that the evaluation unit is configured to influence the respective characteristic of the first signal and of the second signal. Alternatively, the evaluation unit is an integral part of the gate control circuit itself. Since the evaluation unit is configured on this basis to detect the gate voltages and the gate currents, as well as to influence the first and second signals, a control with regard to one or multiple of the control objectives stated above is made possible by the evaluation unit. In the case of a control by way of example with regard to particular individual conductances, which preferably ensures that the respective individual conductances of the two semiconductor components always correspond, it is thus possible to compensate over time for deviations between the individual conductances due to component tolerances and/or aging, etc., with the aid of the evaluation unit. For this purpose, in principle arbitrary adaptations of the first and/or second signal by the evaluation unit are possible, which take place, for example, in the form of adaptations of amplitude and/or of frequency and/or of direct components of the first and/or second signal. It is pointed out that influences on the total conductance of the parallel connection of the two semiconductor components may be present with different levels of intensity, depending on the control objectives used in each case. Such intentional deviations of the total conductance as a function of particular control objective variables are therefore likewise to be regarded as allowable fluctuations of the total conductance, which are described in herein and which thus do not conflict with holding the total conductance "essentially" constant. Based on the control described above, with the aid of the evaluation unit it is also possible to ascertain a state of the two semiconductor components and/or corresponding circuit components by respective adaptations of the first signal and/or of the second signal. In other words, storing historical values and evaluating the change in these values over time allows a conclusion concerning an instantaneous state of health and/or aging state and/or degradation and/or drift, etc., of the particular semiconductor components and/or of further components (parts, connection technology, etc.) of the circuit arrangement. Such deviations may be compared to predefined threshold values, for example, with the aid of the evaluation unit, so that an exceedance of one or multiple of these threshold values may result in a switch-off or power reduction, or in further measures in order to protect the circuit arrangement.

In a further advantageous embodiment of the present invention, the circuit arrangement also includes at least one further parallel connection made up of a third semiconductor component and a fourth semiconductor component, respective barrier layer temperatures of the third semiconductor component and of the fourth semiconductor component being ascertained analogously to the barrier layer temperatures of the first semiconductor component and of the second semiconductor component. The third and fourth semiconductor components preferably form a parallel connection to the first and second semiconductor components, for example to switch particularly high loads. In addition, it is possible to combine fifth and sixth semiconductor components or further pairings of semiconductor components, connected in parallel, within the circuit arrangement.

According to a second aspect of the present invention, an electrical system is provided that includes a circuit arrangement according to an embodiment disclosed above, the electrical system being configured to operate the first semiconductor component and the second semiconductor component, at least temporarily, in particular repeatedly, in a forward mode. It is evident that the features, feature combinations, and the advantages resulting therefrom correspond to those stated in conjunction with the first-mentioned aspect of the present invention, so that reference is made to the above statements in order to avoid repetitions.

The electrical system is advantageously a drive converter and/or a DC/DC voltage converter and/or an AC/AC voltage converter and/or an inverter and/or a rectifier and/or a switch mode power supply and/or an electrical system of a vehicle, without thus being limited to the above-stated embodiments of the electrical system.

According to a third aspect of the present invention, a method for ascertaining barrier layer temperatures of gate-controlled semiconductor components is provided. According to an example embodiment of the present invention, in a first step of the method according to the present invention, a first gate voltage of a first semiconductor component is varied with the aid of a first signal, and a second gate voltage of a second semiconductor component is varied with the aid of a second signal opposite the first signal, at least within a predefined time period in an active forward mode of the two semiconductor components, and a total conductance of the two semiconductor components that results from the parallel connection remaining essentially constant. In a second step of the method according to the present invention, a first gate current of the first semiconductor component and a second gate current of the second semiconductor component are detected. In a third step of the method according to the present invention, a respective barrier layer temperature of the first semiconductor component and of the second semiconductor component is ascertained based on the respective varied gate voltages and the respective corresponding gate currents. It is evident that the features, feature combinations, and the advantages resulting therefrom correspond to those stated in conjunction with the first- and second-mentioned aspects of the present invention, so that reference is made to the above statements in order to avoid repetitions.

BRIEF DESCRIPTION OF THE DRAWINGS

Exemplary embodiments of the present invention are described in greater detail below with reference to the figures.

DETAILED DESCRIPTION OF EXAMPLE EMBODIMENTS

Figure 1:
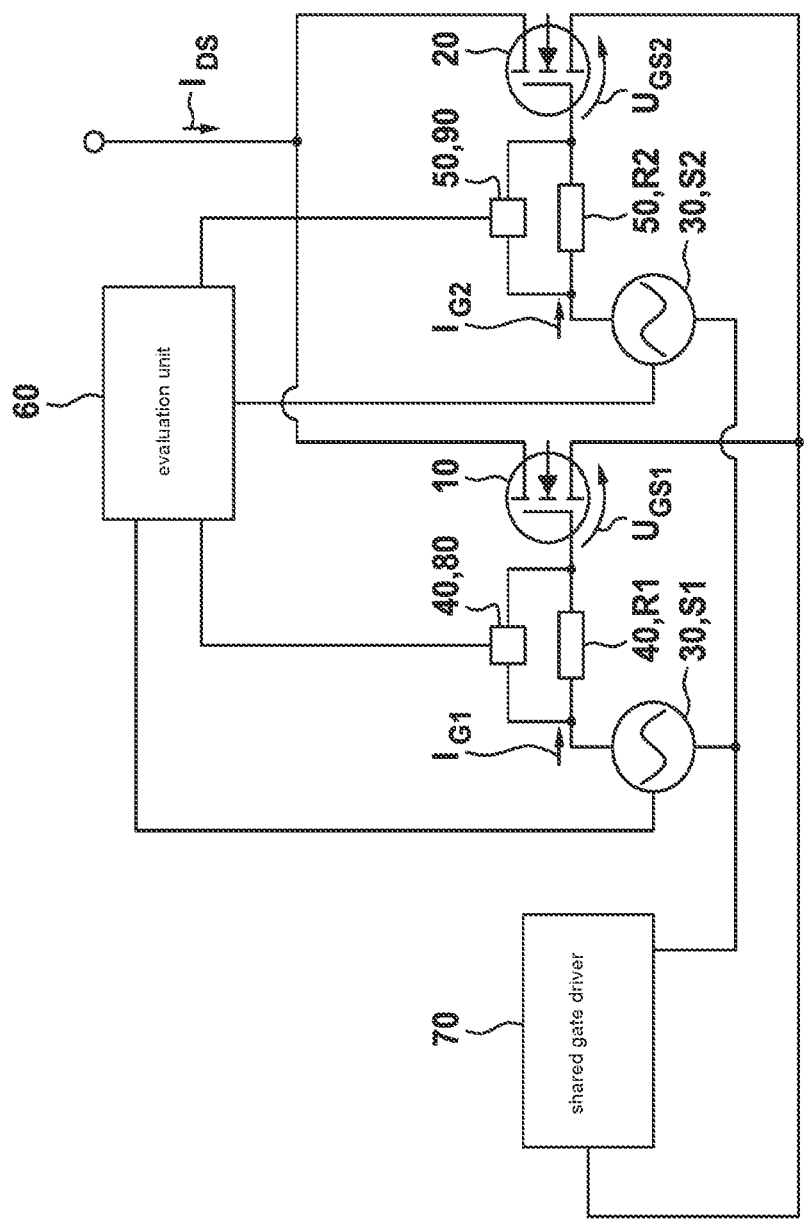
FIG. 1 shows a circuit diagram of one specific embodiment of a circuit arrangement according to an example embodiment of the present invention.

FIG. 1 shows a circuit diagram of one specific embodiment of a circuit arrangement according to the present invention. The circuit arrangement in this specific embodiment includes a first MOSFET 10 and a second MOSFET 20, which in the present case are designed as structurally identical SiC MOSFETs and connected to one another in parallel.

The circuit arrangement also includes a gate control circuit 30 that is configured, at least within a predefined measuring time period, in an active forward mode of the two MOSFETs 10, 20 to vary a first gate-source voltage $U_{GS1}$ of first MOSFET 10 with the aid of a first signal S1, and to vary a second gate-source voltage $U_{GS2}$ of second MOSFET 20 with the aid of a second signal S2 that is opposite first signal S1, a total conductance that results from the parallel connection of first MOSFET 10 and second MOSFET 20, and thus a total working current $I_{DS}$ via which an electric motor is activated here, remaining essentially constant. First signal S1 and second signal S2 here are sinusoidal signals, a signal pattern of second signal S2 being rotated by 180° relative to first signal S1.

The varying of gate-source voltages $U_{GS1}$, $U_{GS2}$ takes place around respective preset operating points of MOS- FETs 10, 20, which are always simultaneously and identically set for first MOSFET 10 and second MOSFET 20 via a shared gate driver 70.

The circuit arrangement also includes an evaluation unit 60, designed as a microcontroller, which is connected to a first current measuring device 40 and to a second current measuring device 50, using information technology. Current measuring devices 40, 50 are situated in respective gate-source circuits of MOSFETs 10, 20, and are made up of a first measuring shunt R1 and a corresponding A/D converter 80, or a second measuring shunt R2 and a corresponding A/D converter 90, respectively. A/D converters 80, 90 are configured to detect voltages across first measuring shunt R1 and second measuring shunt R2, respectively, and to transfer results of the detection to evaluation unit 60. Alternatively, A/D converters 80, 90 are A/D converters integrated into evaluation unit 60.

Based on this configuration, evaluation unit 60 is configured to detect a first gate current $I_{G1}$ of first MOSFET 10 with the aid of first current measuring device 40, and to detect a second gate current $I_{G2}$ of second MOSFET 20 with the aid of second current measuring device 50, and based on respective varied gate-source voltages $U_{GS1}$, $U_{GS2}$ and gate currents $I_{G1}$, $I_{G2}$ respectively corresponding thereto, to ascertain a barrier layer temperature of first MOSFET 10 and of second MOSFET 20.

Evaluation unit 60 as shown here is advantageously additionally connected to gate control circuit 30 using information technology, so that evaluation unit 60 is enabled to adapt first signal S1 and second signal S2 independently of one another. In this way, evaluation unit 60 is specifically configured to operate respective barrier layer temperatures of the two MOSFETS 10, 20 in the range of their maximum load limit, while at the same time it is ensured that total working current $I_{DS}$ remains essentially constant in an "on" state of the two MOSFETs 10, 20.

In addition, evaluation unit 60 is configured to store over time particular measured current and voltage values and ascertained barrier layer temperature values in a memory unit (not shown), and to monitor a respective state of health of the two MOSFETS 10, 20 based on an evaluation of a plurality of such historical values.

The circuit arrangement shown here is used, for example, in an electrical system (not shown) that is configured to repeatedly operate first MOSFET 10 and second MOSFET 20 in a forward mode. The electrical system is designed as an inverter, for example.

Figure 2:
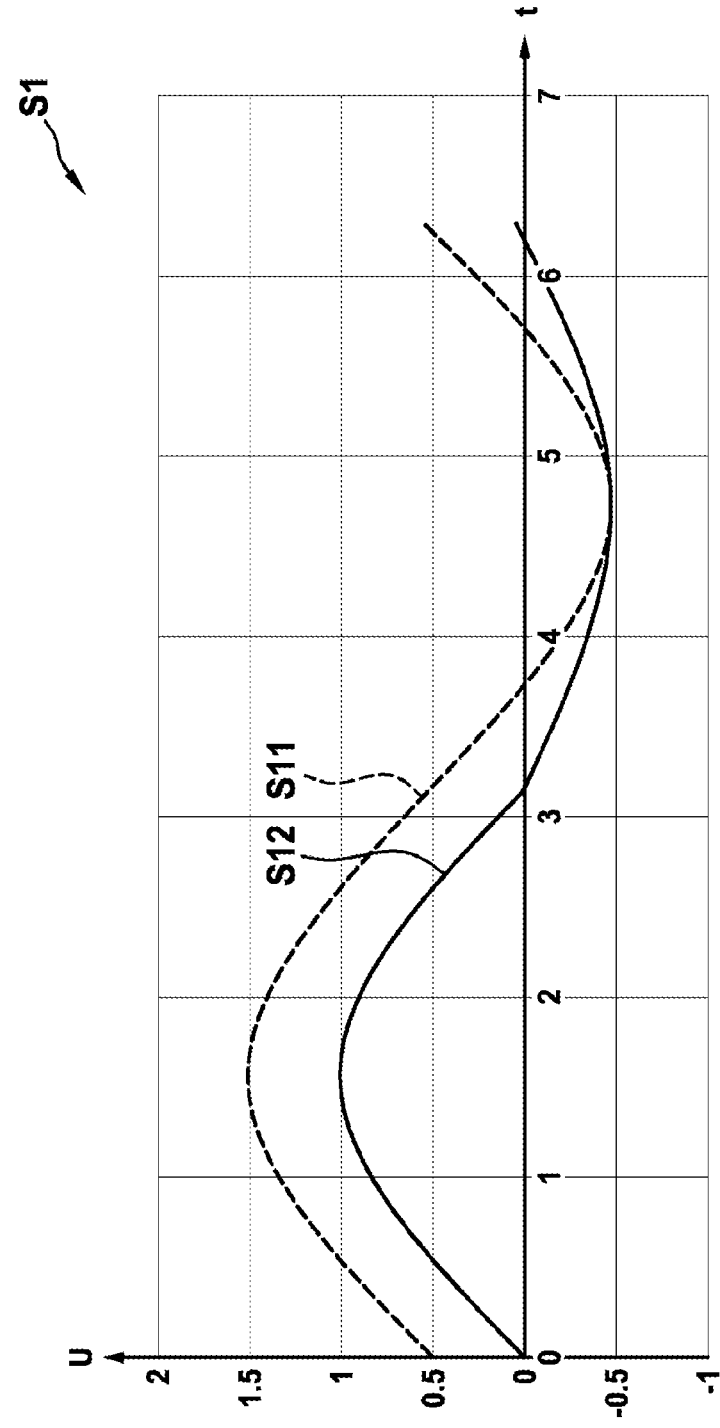
FIG. 2 shows curve patterns of a first or second signal according to the present invention in different specific embodiments.

FIG. 2 shows curve patterns of a first signal S1 according to the present invention in different specific embodiments. It is pointed out that above-described second signal S2 according to the present invention is derivable from the curve patterns shown here by a rotation of first signal S1 by 180°, but for reasons of clarity is not shown here. Curve S11 represents a sinusoidal first signal S1, while curve S12 represents a signal with asymmetrical half-waves which is usable for a uniform variation of the conductance of first MOSFET 10, since this nonlinearity of the characteristic curve of first MOSFET 10 is compensated for, at least in part. The above discussion analogously applies for second signal S2, which is correspondingly usable for a uniform variation of the conductance of second MOSFET 20.

What is claimed is:

1. A circuit arrangement for ascertaining barrier layer temperatures of gate-controlled semiconductor components, comprising:
a first semiconductor component;
a second semiconductor component;

a gate control circuit;
a first current measuring device;
a second current measuring device; and
an evaluation unit,
wherein
the first semiconductor component and the second semiconductor component are gate-controlled semiconductor components that are connected in parallel to one another, so that a respective conductance of the first and second semiconductor components is settable by the gate control circuit,
the gate control circuit is configured to, at least within a predefined time period, in an active forward mode of the first and second semiconductor components, vary a first gate voltage of the first semiconductor component using a first signal, and vary a second gate voltage of the second semiconductor component using a second signal that is opposite the first signal, a total conductance of the first and second semiconductor components that results from the parallel connection remaining essentially constant,
the evaluation unit is configured to:
detect a first gate current of the first semiconductor component using the first current measuring device, and detect a second gate current of the second semiconductor component using the second current measuring device, and
ascertain, based on the varied first and second gate voltages, respectively, and the first and second gate currents, respectively, a respective barrier layer temperature of the first semiconductor component and of the second semiconductor component.

2. The circuit arrangement as recited in claim 1, wherein at least one of the first semiconductor component or the second semiconductor component is:
a MOSFET, or
an IGBT, or
an HEMT.

3. The circuit arrangement as recited in claim 1, wherein the predefined time period is a measuring time period for detecting particular barrier layer temperatures.

4. The circuit arrangement as recited in claim 1, wherein the first signal and the second signal are at least one of the following:
identical signals that are phase-shifted by 180° relative to one another,
sinusoidal signals, or
signals with asymmetrical half-waves.

5. The circuit arrangement as recited in claim 1, wherein the evaluation unit is configured to adapt at least one of the first signal or the second signal, as a function of at least one of the following:
respective individual conductances of the first semiconductor component and of the second semiconductor component,
individual working currents of the first semiconductor component and of the second semiconductor component,
a total conductance of the first semiconductor component and the second semiconductor component,
a total working current of the first semiconductor component and the second semiconductor component,
the respective barrier layer temperatures of the first semiconductor component and of the second semiconductor component, respective operating points of the first semiconductor component and of the second semiconductor component, or an overall temperature of the first semiconductor component and the second semiconductor component.

6. The circuit arrangement as recited in claim 5, wherein the evaluation unit is configured to ascertain, based on respective adaptations of at least one of the first signal or the second signal, at least one of:

a state of the first and second semiconductor components, or a state of corresponding circuit components.

7. The circuit arrangement as recited in claim 1, further comprising:

at least one further parallel connection made up of a third semiconductor component and a fourth semiconductor component, wherein respective barrier layer temperatures of the third semiconductor component and of the fourth semiconductor component are ascertained analogously to the barrier layer temperatures of the first semiconductor component and of the second semiconductor component.

8. An electrical system, comprising:

a circuit arrangement for ascertaining barrier layer temperatures of gate-controlled semiconductor components, including:

a first semiconductor component;
a second semiconductor component;
a gate control circuit;
a first current measuring device;
a second current measuring device; and
an evaluation unit,
wherein the first semiconductor component and the second semiconductor component are gate-controlled semiconductor components that are connected in parallel to one another, so that a respective conductance of the first and second semiconductor components is settable by the gate control circuit, the gate control circuit is configured to, at least within a predefined time period, in an active forward mode of the first and second semiconductor components, vary a first gate voltage of the first semiconductor component using a first signal, and vary a second gate voltage of the second semiconductor component using a second signal that is opposite the first signal, a total conductance of the first and second semiconductor components that results from the parallel connection remaining essentially constant, the evaluation unit is configured to:

detect a first gate current of the first semiconductor component using the first current measuring device, and detect a second gate current of the second semiconductor component using the second current measuring device, and ascertain, based on the varied first and second gate voltages, respectively, and the first and second gate currents, respectively, a respective barrier layer temperature of the first semiconductor component and of the second semiconductor component;

wherein the electrical system is configured to operate the first semiconductor component and the second semiconductor component, at least temporarily, repeatedly, in the forward mode.

9. The electrical system as recited in claim 8, wherein the electrical system is at least one of the following:

a drive converter,
a DC/DC voltage converter,
an AC/AC voltage converter,
an inverter,
a rectifier,
a switch mode power supply, or
an electrical system of a vehicle.

10. A method for ascertaining barrier layer temperatures of gate-controlled semiconductor components, comprising the following steps:

varying, at least within a predefined time period, in an active forward mode of first and second semiconductor components, a first gate voltage of the first semiconductor component using a first signal, and varying a second gate voltage of the second semiconductor component using a second signal opposite the first signal, a total conductance of the first and second semiconductor components that results from the parallel connection remaining essentially constant;

detecting a first gate current of the first semiconductor component and a second gate current of the second semiconductor component, and ascertaining a respective barrier layer temperature of the first semiconductor component and of the second semiconductor component, based on the varied first and second gate voltages, respectively, and the first and second gate currents, respectively.

* * * * *